(12) United States Patent
Behl et al.

(10) Patent No.: US 9,361,117 B2
(45) Date of Patent: Jun. 7, 2016

(54) TAG-BASED IMPLEMENTATIONS ENABLING HIGH SPEED DATA CAPTURE AND TRANSPARENT PRE-FETCH FROM A NOR FLASH

(71) Applicants: STMicroelectronics (Grenoble 2) SAS, Grenoble (FR); STMicroelectronics International N.V., Amsterdam (NL)

(72) Inventors: Ankur Behl, New Delhi (IN); Gregory Poivre, Grenoble (FR)

(73) Assignees: STMICROELECTRONICS (GRENOBLE 2) SAS, Grenoble (FR); STMICROELECTRONICS INTERNATIONAL N.V., Amsterdam (NL)

(*) Notice: Subject to any disclaimer, the term of this patent is extended or adjusted under 35 U.S.C. 154(b) by 300 days.

(21) Appl. No.: 14/266,010

(22) Filed: Apr. 30, 2014

(65) Prior Publication Data
US 2015/0318049 A1    Nov. 5, 2015

(51) Int. Cl.
| | | |
|---|---|---|
| G06F 1/00 | (2006.01) |
| G06F 1/04 | (2006.01) |
| G06F 9/44 | (2006.01) |
| G11C 16/32 | (2006.01) |
| G11C 7/10 | (2006.01) |
| G11C 7/22 | (2006.01) |
| G11C 16/04 | (2006.01) |
| G06F 1/10 | (2006.01) |
| G06F 1/08 | (2006.01) |

(52) U.S. Cl.
CPC ............... *G06F 9/44* (2013.01); *G06F 9/4401* (2013.01); *G06F 9/4403* (2013.01); *G11C 7/1072* (2013.01); *G11C 7/222* (2013.01); *G11C 16/0416* (2013.01); *G11C 16/32* (2013.01); *G06F 1/08* (2013.01); *G06F 1/10* (2013.01)

(58) Field of Classification Search
CPC ...................................... G06F 1/08; G06F 1/10
See application file for complete search history.

(56) References Cited

U.S. PATENT DOCUMENTS

| | | | | |
|---|---|---|---|---|
| 2005/0083775 | A1* | 4/2005 | Jeong | G11C 7/1066 365/73 |
| 2006/0020860 | A1* | 1/2006 | Tardif | G01R 31/318566 714/724 |
| 2007/0174514 | A1* | 7/2007 | Lee | G06F 1/3203 710/52 |
| 2008/0126588 | A1* | 5/2008 | Chong | G06F 13/387 710/13 |
| 2009/0161453 | A1* | 6/2009 | Giovannini | G11C 7/1078 365/193 |
| 2010/0020910 | A1* | 1/2010 | Bhagavatheeswaran | H03L 7/0891 375/376 |
| 2013/0290748 | A1* | 10/2013 | Zhu | G06F 1/26 713/300 |

* cited by examiner

*Primary Examiner* — Phil Nguyen
(74) *Attorney, Agent, or Firm* — Gardere Wynne Sewell LLP

(57) ABSTRACT

Embodiments disclosed herein generally relate for efficiently retrieving boot code for a processor from serial NOR flash memory. When a boot code request is received, a request handler in data capture logic tags successive address read requests to indicate whether the requests indicate contiguous addresses in the NOR flash memory for the boot code. Different circuitry in the data capture logic operates on different mesochronous clock signals. One clock signal drives the capture of boot code from NOR flash, and the other controls synchronized tagging, storing, pre-fetching, and transmitting of the captured boot code data.

27 Claims, 4 Drawing Sheets

TAG-BASED IMPLEMENTATIONS ENABLING HIGH SPEED DATA CAPTURE AND TRANSPARENT PRE-FETCH FROM A NOR FLASH

BACKGROUND

Flash memory is a type of nonvolatile semiconductor memory that maintains storage of data even when the memory device is not electrically powered. It is an improved version of electrically erasable programmable read-only memory (EEPROM). EEPROM erases and rewrites its content one byte at a time; whereas flash memory erases and writes data in entire blocks, making it a very fast memory compared to EEPROM. Traditional mobile and embedded devices present designers with conflicting requirements at every turn, such as speedy boot times at reduced cost, high performance with low pin counts, and minimal board space with maximum functionality.

There are two main types of flash memory used in digital electronics: NAND and NOR flash memory. Both store information in an array of memory cells made from transistors, but they differ in how such transistors are used. NAND flash also uses transistors, but they are connected in a way that resembles a NAND gate. Several transistors are connected in series, and the bit line is asserted low only if all word lines are pulled high. NOR flash memory, on the other hand, has one end of each cell grounded and the other end connected directly to a bit line. This arrangement acts like a NOR gate because the corresponding storage transistor asserts the output bit line low when one of the word lines is pulled high. Of the two flash memory types, NOR flash is commonly used in mobile devices due to its non-volatility, durability, and fast access times.

One key application of NOR flash is to assist in the boot-up of a system on a chip (SoC). The system boot time is the time it takes to get the SoC up and running after power is turned on or a reset is initiated. As a nonvolatile type of memory, the boot code for an SoC can be stored in NOR flash, retrieved, and executed-in-place to boot the SoC.

SUMMARY

This Summary is provided to introduce a selection of concepts in a simplified form that are further described below in the Detailed Description. This Summary is not intended to identify key or essential features of the claimed subject matter, but instead is provided to illustrate different embodiments.

One aspect is directed is directed to a controller operating on a controller clock signal and electrically coupled to a flash memory. A transmitter state module receives a controller clock signal and selectively generates a selective clock signal based on the controller clock signal. The transmitter state module also provides the selective clock signal to an input/output (I/O) socket; wherein, passage of the selective clock signal through the I/O socket creates a feedback clock signal. Data capture logic receives the feedback clock signal from the I/O socket and includes storage elements to capture data from the flash memory device according to the feedback clock signal.

Another aspect is directed to a controller operating on a controller clock signal and electrically coupled to a flash memory. A request handler receives read requests from a processor and stores tags corresponding to the read requests in a pack storage element. The tags indicate whether each of the read requests are contiguous or non-contiguous. A transmission state module generates a selective clock signal based on the controller clock signal and provides the selective clock signal to an I/O socket to generate a feedback clock signal. Data capture logic receives the feedback clock signal from the I/O socket and includes one or more additional storage elements configured to capture data from the flash memory device according to the feedback clock signal. A response handler provides the processor with the data until a non-contiguous tag is received.

Another aspect is directed to controller operating on a controller clock signal and electrically coupled to a flash memory. A request handler receives read requests from a processor and stores tags corresponding to the read requests in a pack storage element. The tags indicate whether each of the read requests are contiguous or non-contiguous. A transmission state generates a selective clock signal based on the controller clock signal and provides the selective clock signal to the I/O socket to generate a feedback clock signal. Data capture logic receives the feedback clock signal from the I/O socket and includes one or more additional storage elements for capturing data from the flash memory device according to the feedback clock signal. A receiver state module retrieves and stores the data captured by the data capture logic in a data memory element according to the controller clock signal. A response handler provides the processor with the data until a non-contiguous tag is received.

The foregoing and other features and advantages of the present disclosure will become more apparent from the following detailed description of the embodiments read in conjunction with the accompanying drawings. The detailed description and drawings are merely illustrative of some different embodiments, rather than limiting the scope of the invention as defined by the appended claims and equivalents thereof.

DETAILED DESCRIPTION

Embodiments disclosed herein generally relate to systems and methods for efficiently retrieving data, such as boot code, for an SoC from a nonvolatile serial NOR flash. One particular embodiment allows rapid system boot from serial flash memory. A high speed data capture is achieved through the introduction of a loopback clock, relying on a tag-based implementation to synchronize the information between launching and receiving clock domains on the SoC. Transparent pre-fetch is achieved through a combination of two tag-based mechanisms on the SoC. On each new system request to a non-contiguous memory area, a controller will initiate an uninterrupted sequence of reads to subsequent addresses. These data will be used to serve the subsequent continuous read requests. To transparently serve a fresh access to a non-contiguous address, a tag is used to indicate that certain excess data can be discarded. Another tag is used to identify the data belonging to a fresh sequence and prevent the data from being lost when the pre-fetched data are discarded. The high speed data capture raises the interface operating frequency, and the transparent pre-fetch significantly reduces the impact of interconnect latency, thus the two mechanisms create an efficient system-boot technique.

Figure 1:
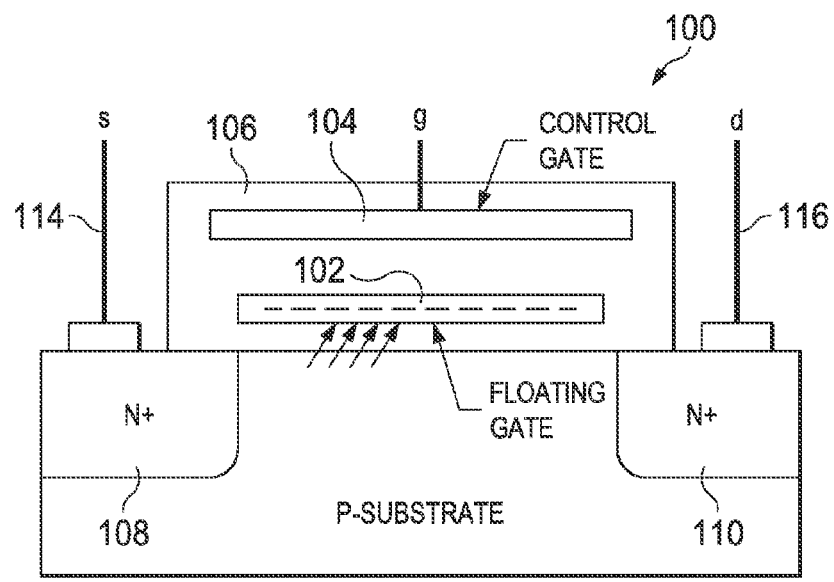
FIG. 1 illustrates a diagram of a single npn-type floating-gate metal-oxide-semiconductor field-effect transistor (FG-MOSFET) with a floating gate that can be used as a single cell in a NOR flash memory device.

Having generally described various embodiments, a number of key concepts should be clarified to better understand the innovative systems and techniques described herein. Turning to the drawings, FIG. 1 illustrates a diagram of a single npn FG-MOSFET 100 with a floating gate 102 that can be used as a single cell in a NOR flash memory device. A NOR flash memory consists of an array of "memory cells" used to store bits of information—i.e., ones or zeroes. Each cell comprises a FG-MOSFET 100 with a floating gate 102 on which electrical charge can be stored or removed (i.e., erased). The floating gate 102 is electrically isolated by an oxide layer, trapping any electrons placed on the floating gate 102. When electrons are present on the floating gate 102, no current flows through the FG-MOSFET 100, indicating a logic zero. When electrons are removed from the floating gate 102, the FG-MOSFET 100 starts conducting and current flows, indicating a logic one. This is achieved by applying voltages between a control gate 104 (through gate contact 112) and source 108 or drain 110 through source contact 114 or drain contact 116, respectively.

In operation, when the floating gate 102 holds a charge, it partially cancels the electric field from the control gate 104 and therefore modifies the threshold voltage ($V_T$) of the cell. This requires more voltage to be applied to the control gate 104 to make the FG-MOSFET 100 conduct. For read-out, a voltage intermediate between the possible threshold voltages is applied to the control gate 104, and the FG-MOSFET 100 channel's conductivity is tested to see whether it is conducting or insulating. Again, current flow (or lack thereof) through the FG-MOSFET 100 channel indicates different logic values stored on the floating gate 102.

Figure 2:
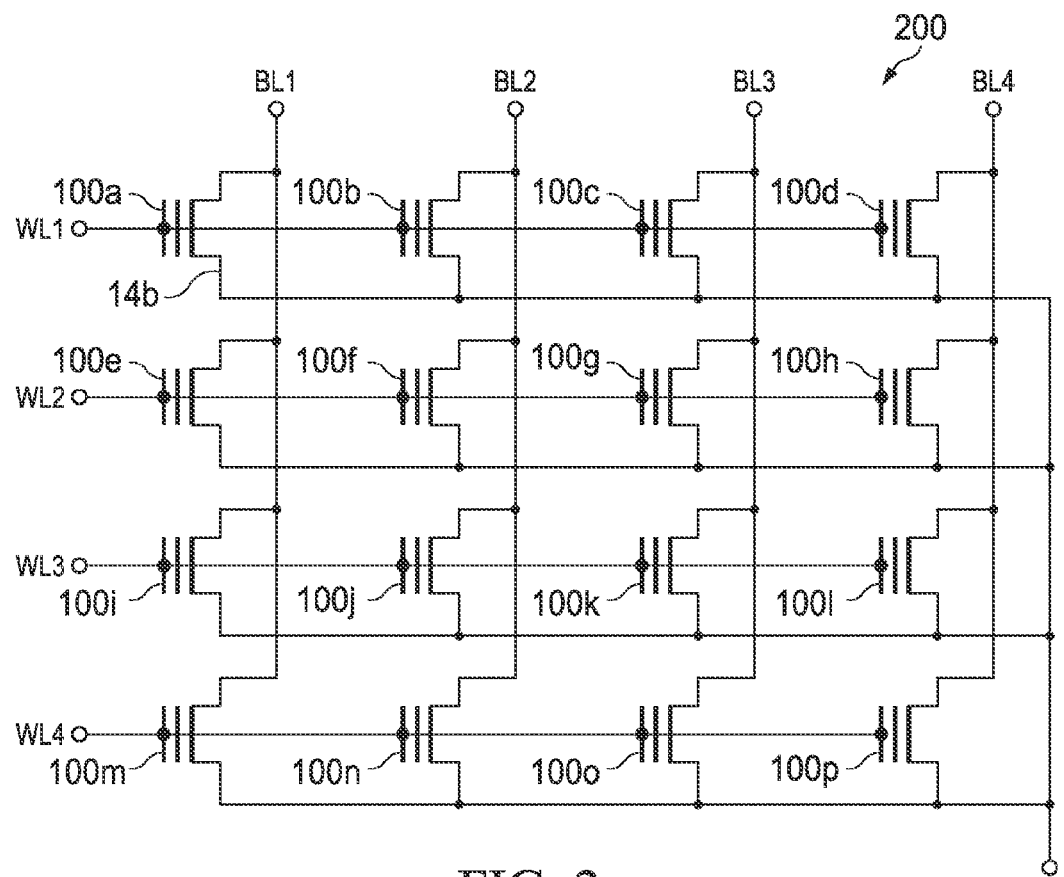
FIG. 2 illustrates a schematic representation of a NOR flash memory device 200.

FIG. 2 illustrates a schematic representation of a NOR flash memory device 200. Memory device 200 includes an array of memory cells comprising FG-MOSFETs 100a-p that are connected in a NOR-type fashion to form four bit lines (BL1-4) and four word lines (WL1-4). Each FG-MOSFETs 100a-p has a floating gate 102, control gate 104, source 108, and drain 110. Each BL1-4 comprises four FG-MOSFETS 100 with drains 110 electrically connected to each other. Each WL1-4 comprises four FG-MOSFETS 100 with control gates 104 of each electrically connected to each other. In addition, each FG-MOSFETS 100a-p in the array has its source 108 coupled to a common source terminal (CS).

FG-MOSFETS 100a-p may be individually addressed via the respective bit line and word line using a decoder and control circuitry for writing, reading, or erasing bits in the cells. Specifically, the NOR flash memory device 200 can be configured to store data (e.g., a boot code) that can be used by an SoC to start up. While NOR flash memory device 200 supports direct random access to any address in the FG-MOSFETS 100a-p at very high speeds (e.g., 65 Mbps), such speeds make it difficult to successfully retrieve the stored boot code because, as clock speeds increase, the available data window for retrieval becomes smaller. An SoC may be in communication with a NOR flash memory device 200, but the two are physically separated from each other. Retrieving data from the NOR flash memory device 200 is not instantaneous; rather, it is delayed by the physical interfaces between the two.

It should be noted that NOR flash memory device 200 is provided merely as an example of one type of NOR flash memory design. Alternative configurations may also be used and will be generally understood to those skilled in the art. Also, embodiments discussed below often reference the retrieval of generic data from the memory cells of the NOR flash memory device 200. In one embodiment, the retrieved data comprises instructions and other information for starting up an SoC, i.e., boot code information. While the description below sometimes refers to the retrieved flash memory data as simply "data" or "memory values" for the sake of clarity, it should be understood that some embodiments use the systems, methods, and techniques described herein to retrieve boot code information from NOR flash memory 200.

Figure 3:
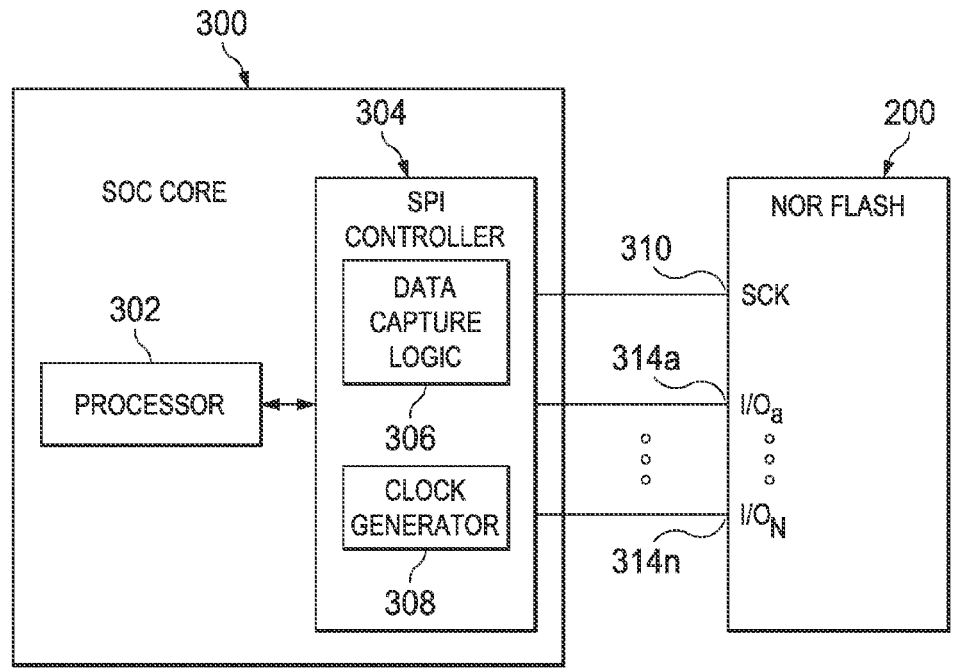
FIG. 3 illustrates a block diagram of an SoC core retrieving boot code data from NOR flash memory device.

FIG. 3 illustrates a block diagram of an SoC core 300 retrieving boot code data from NOR flash memory device 200. The SoC core 300 represents the core portion of an SoC and includes a processor 302 (e.g., microcontroller, microprocessor, computer processing unit (CPU), or the like) and a serial peripheral interface (SPI) controller 304. The SPI controller 304 includes data capture logic 306 and a clock generator 308. The SoC core 300 is electrically connected through a circuit board to the NOR flash 200, which includes its own clock input (SCK) 310 and one or more inputs/outputs (I/Os) 314a-n. One skilled in the art will understand and appreciate that SoC core 300 may include additional hardware and software, such as, for example and without limitation, a transport processor, video decoder, data line terminal (e.g., Ethernet), or the like, but such hardware and software need not be discussed at length herein.

In one embodiment, communication between the SPI controller 304 and the NOR flash memory device 200 occurs in the form of commands that begin with an instruction selecting the type of information transfer or device operation to be performed. Commands may also have an address, instruction modifier, latency period, data transfer to the memory, or data transfer from the memory. Instruction, address, and data information may be transferred serially or in parallel between the SPI controller 304 and the NOR flash memory device 200. In one embodiment, instructions are transferred from the SPI controller 304 to the NOR flash memory device 200 as a single bit serial sequence on the SCK 310, and data may be sent back to the SPI controller 304 serially through one of the I/Os 314, described herein as the "write" I/O and referenced below as I/O 314b.

In one mode of operation, instructions, addresses, and data write requests are transmitted on one I/O pad, and data reads are performed on a second I/O pad. While discussed in more detail below, an output clock signal (SCK 310) is generated and sent from the SPI controller 304 to the NOR flash memory device 200. SCK 310 is a version (not an exact copy) of an internal clock signal generated by the clock generator 308. Thus, SCK 310 is not an exact copy of the internal clock signal generated by the clock generator 308, and only selected edges of this internal clock signal are transmitted out as SCK 310.

The SPI controller 304 initiates a read request of the NOR flash memory device 200 by sending SCK 310 to choose the direction of the I/O pads for data transmission/reception on each cycle of SCK 310. In response, the NOR flash memory device 200 retrieves the requested data—which, in one embodiment, is the boot code for the SoC core 300—from its memory cells and transmits the data back to the SPI controller 304 in accordance with the SCK 310, either at a single-edge data rate (SDR), double-edge data rate (DDR). The SPI controller 304 captures the data from the NOR flash device 200 using the data capture logic 306 and provides the captured data to the processor 302 for execution. While explained in greater detail below, the data capture logic 306 includes a collection of hardware circuitry capable of capturing the data from the NOR flash memory device 200 and providing the captured data to the processor 302 for execution.

NOR flash memory device 200 and SPI controller 304 may use a single, dual, quadruple, or other number of I/O interface to communicate data. As illustrated, NOR flash memory device 200 may include N number of I/O interfaces 314. In one specific embodiment, SPI controller 304 uses a quad I/O interface to simultaneously receive data from four I/Os 314 at during trigger edges of SCK 310. To achieve highest read performance which will enable rapid boot, in one embodiment SPI controller 304 uses: (1) a DDR-read protocol using either legacy SPI×1 or advanced ×2, or ×4 interface signals to transfer address and data on both edges of the clock signal (SCK).

Figure 4:
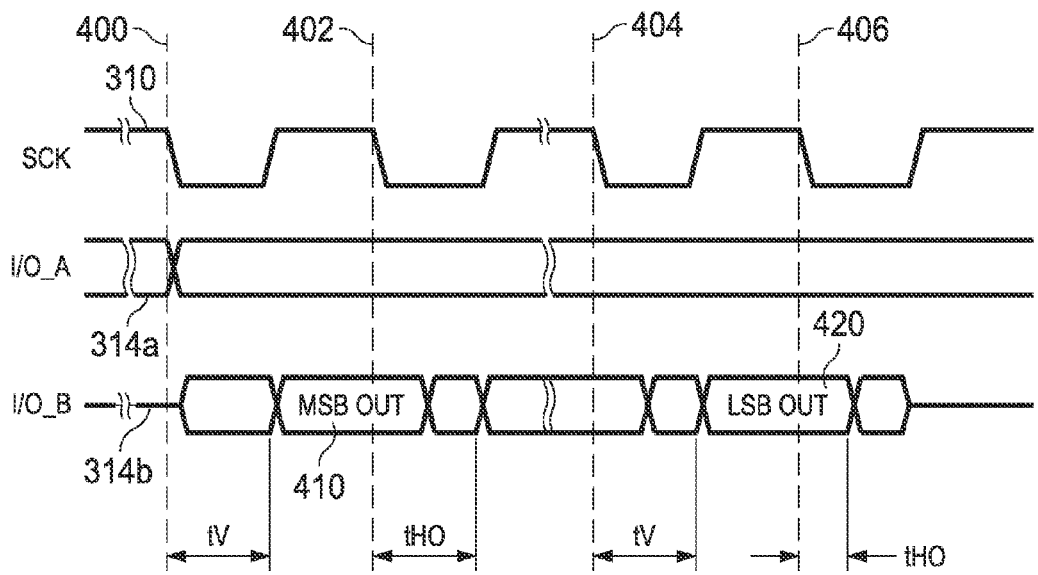
FIG. 4 illustrates a waveform diagram showing waveforms for a NOR flash memory device responding to a controller that enables data capture.

FIG. 4 illustrates a waveform diagram showing waveforms for the NOR flash memory device 200 responding to the SPI controller 304 enabling data capture on a single flash output (I/Ob 314b) according to SCK 310. The illustrated embodiment specifically shows a negative-edge triggered data retrieval in which a read edge 400 occurs and data begins to get captured on I/Ob 314b. Data is captured sequentially from a most significant bit (MSB) 410 to a least significant bit (LSB) 420.

NOR flash memory devices 200 does not instantaneously output the memory value at the read edge 400 of SCK 310. Instead, a delay exists between the read edge 400 and the time at which data is outputted through I/Ob 314b. This delay is commonly referred to as the clock-to-data-out time (tV) and represents the time period between an SCK 310 edge trigger and the output of a data value on I/Ob 314b. A typical 133 MHz/7.5 ns NOR flash memory device 200 experiences a tV of approximately 6.5 ns. Moreover, the I/Ob 314b holds the memory value for a specific amount of time after the subsequent SCK 310 clock edge 402. This hold time (tHO) defines the timeframe that data remains valid after the next SCK 310 edge. From these timing values (tV and tHO), a data eye (tDV)—i.e., timeframe for the SPI controller 304 to successfully capture the memory value—can be calculated as the SCK 310 period (T) minus the time until data becomes valid (tV) and plus the hold time (tHO) after the next falling clock edge:

$$tDV=T-tV+tHO$$

Faster clock signals of SCK 310 make it difficult to for the data capture logic 306 to properly capture the data on I/Ob 314b because the window for capturing such data is relatively small. Also, the SoC core 300 and the NOR flash memory device 200 are electrically connected to each other through a circuit board, I/O sockets, and I/O pins, which all introduce timing delays that can greatly affect the ability to capture NOR flash data, especially considering that the window for capturing such data is largely dependent on the length of tHO. To increase the ability of the SPI controller 304 to cope with these long timing delays and accurately capture data, a feedback clock signal (described in more detail below) is used.

Figure 5:
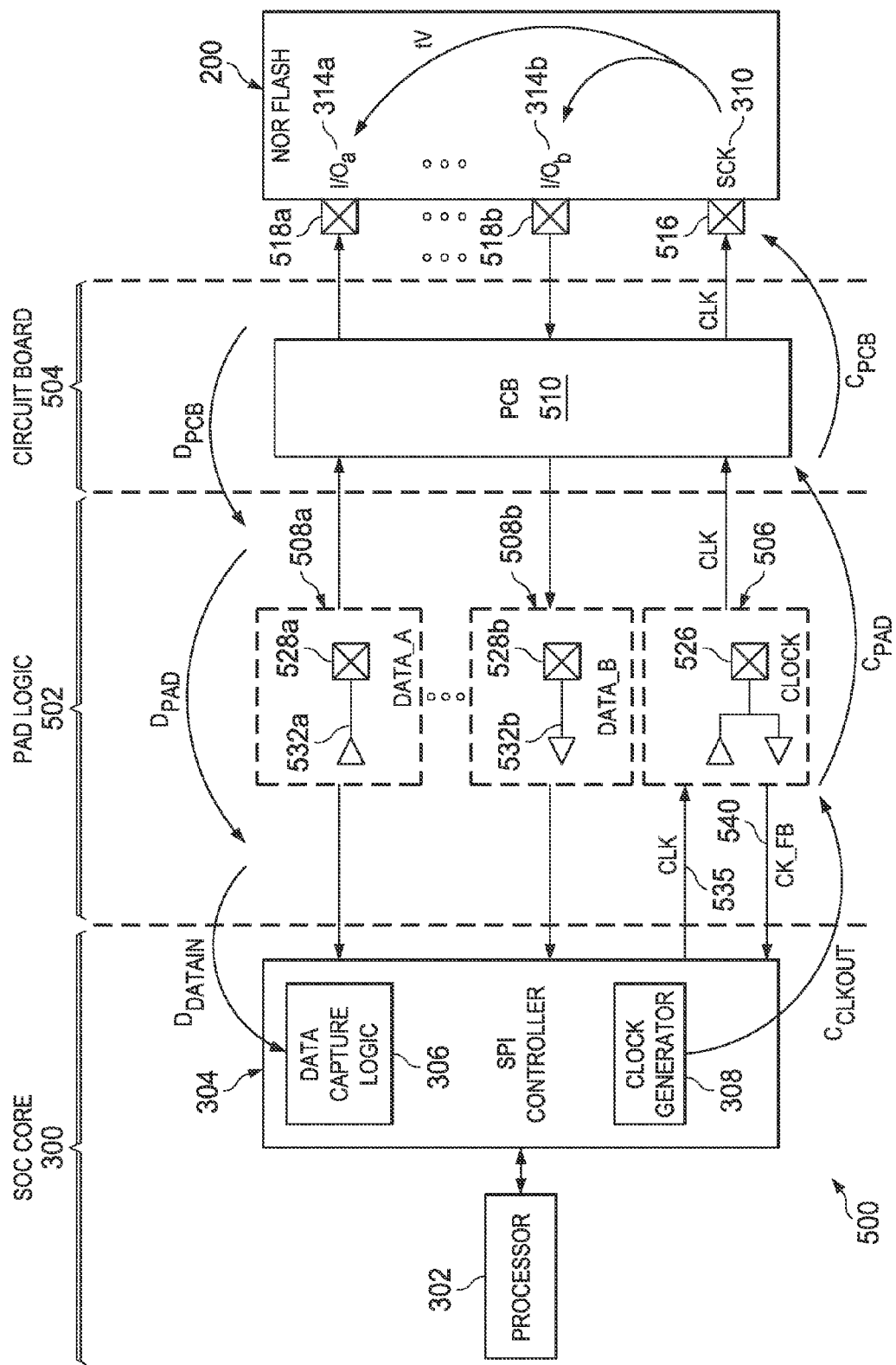
FIG. 5 illustrates a block diagram of an SoC core retrieving boot code data stored in a NOR flash memory device.

FIG. 5 illustrates a block diagram of SoC core 300 retrieving boot code data stored in NOR flash memory device 200 and specifically shows timing delays associated with accessing the boot code. Configuration 500 includes SoC core 300 communicating with flash memory device 200 through a padlogic layer 502 and a circuit board layer 504. Padlogic layer 304 includes I/O sockets 506 and 508a-b that respectively include I/O pads 526 and 528a-b along with various delay circuitry (shown as retiming circuitry 530 and 532a-b) that produce delays between the NOR flash device 200 and the SPI controller 304. Circuit board layer 504 comprises a printed circuit board (PCB) 510 electrically coupling I/O pins 516 and 518a-b of the NOR flash memory device 200 to I/O sockets 506 and 508a-b.

Configuration 500 allows the SoC core 300 to communicate a clock signal CLK 535, generated from an internal clock of CLK generator 308, through clock I/O socket 506 and PCB 510 to I/O pin 516 on NOR flash memory device 200. Though not shown for the sake of clarity, one embodiment also sends a data enable signal to the I/O sockets 508a-b to control the data direction of the I/O sockets 508a-b, which would enable data write or read through the I/O sockets 508a-b. In response to receiving CLK 535, NOR flash memory device 200 responsively reads data in its memory cells and outputs such data through I/O pins 518a-b after the tV time. The SPI controller 304 can capture this read data on I/O pins 518a-b through I/O sockets 508a-b and PCB 410.

As noted above, the data on I/O pins 518a-b may only be available for capture during a small holding window (tHO) after the next clock cycle (N+1). Further compounding the ability to accurately read data from the NOR flash memory device 200 is the fact the I/O sockets 506 and 508a-b and PCB 410 introduce timing delays between I/O pins 518a-b and the data capture logic 306. Because operating speeds for modern Serial Flashes have increased dramatically (e.g., 133 MHz) and holding times (tHO) for data on I/Os 518a-b have diminished, the window for capturing output flash data is becoming smaller and smaller.

Several timing delays between NOR flash memory device 200 and SPI controller 304 are shown in FIG. 4. Generally, these timing delays come in three areas: NOR flash delays (tV), delays getting the CLK 535 from clock generator to 308 to NOR flash memory device 200 ("clock delays"), and delays getting data from the NOR flash memory device 200 to the data capture logic 306 ("data delays"). The worst case tV for a particular flash part is fixed based on the NOR flash memory device 200 and is shown inside the NOR flash memory device 200. The clock delays include delays getting CLK 535 through wire traces to the I/O socket 506 (Cclkout), through the I/O socket (Cpad), and through the PCB 510 (Cpcb) to I/O pin 516 for SCK 310. The data delays include data values passing through the PCB 510 (Dpcb), the I/O sockets 508a-b (Dpad), and through wire traces to the data capture logic 306 (Ddatain). To read data reliably (which is critical for system boot) at high speeds from the NOR flash memory device 200, the maximum data path delays must not exceed the minimum clock path delays:

Maximum Data Path Delay<Minimum Clock Path Delay

Substituting the above flash, clock, and data delays into the above relationship translates to the following:

$$Cclkout+Cpad\_out+Cpcb+tV+Dpcb+Dpad\_in+Ddatain+Fsetup<T+tHO$$

Where Fsetup is the time for the data capture logic 306 to capture a received data value, and T is the period of the CLK 535. The following real-world values in Table 1 show a traditional SPI controller 304 providing a 133 MHz/7.5 ns CLK 535 to a NOR flash memory device 200 with a standard tV of 6.5 ns and tHO of 1 ns:

TABLE 1

Real-World Values For Traditional SPI Controller

| | |
|---|---|
| Cclkout | 0.3 ns |
| Cpad | 3.5 ns |
| Cpcb | 0.2 ns |
| tV | 6.5 ns |
| Dpad | 3.5 ns |
| Ddatain | 0.2 ns |
| Fsetup | 0.3 ns |
| T | 7.5 ns |
| tHO | 1.0 ns |

Adding these numbers to the above equation gives a maximum data path delay of 14.2 ns and an 8.5 ns minimum clock path delay. Thus, the above relationship fails, i.e., the maximum data path delay exceeds the minimum clock path delay.

To manage the long data path and associated data path delays, one embodiment extends the clock path using a feedback clock signal (CK_FB) 540. CK_FB 540 is a mesochronous feedback version of CLK 535 from I/O 406, and thus has the same frequency of CLK 535 but a different phase. CK_FB 540 can be considered the "launching clock domain," and CLK 535 can be considered the "receiving clock domain." While discussed in more detail with respect to FIG. 4, CK_FB 540 is used to clock in memory data on I/Ob 518b into the data capture logic 306 through the I/O socket 508b. With respect to the timing of capturing data from NOR flash memory device 200, CK_FB 540 adds another clock path delay by slowing the data capture logic 306, resulting in the following change to the above equation:

$$C\text{clkout}+C\text{pad\_out}+C\text{pcb}+tV+D\text{pcb}+D\text{pad\_in}+$$
$$D\text{datain}+F\text{setup}<T+tHO+C\text{ck\_fb};$$

where $$C\text{clk\_fb}=C\text{clkout}+C\text{pad\_out}+C\text{clkin}+C\text{pad\_in}$$

The clock path delay Cck_fb refers to the delay from CK_FB 540 and has shown to delay the timing constraints similarly to the Dpad delay, thereby bringing the above equation back into balance with the minimum clock delay exceeding the maximum data path delay. But those data reads done on CK_FB 540 need to be made available on CLK 535 (or, in other embodiment, on CLK 530). While the information about which clock cycles of SCK 310 hold valid data reads on I/O PAD 508b is not available in the CK_FB 540 clock domain, such information is instead available in the TX state module 606 running on the CLK 530 clock domain. Reading valid data across the different clock domains is managed through the tag-based implementation described in more detail below in reference to FIG. 6.

Figure 6:
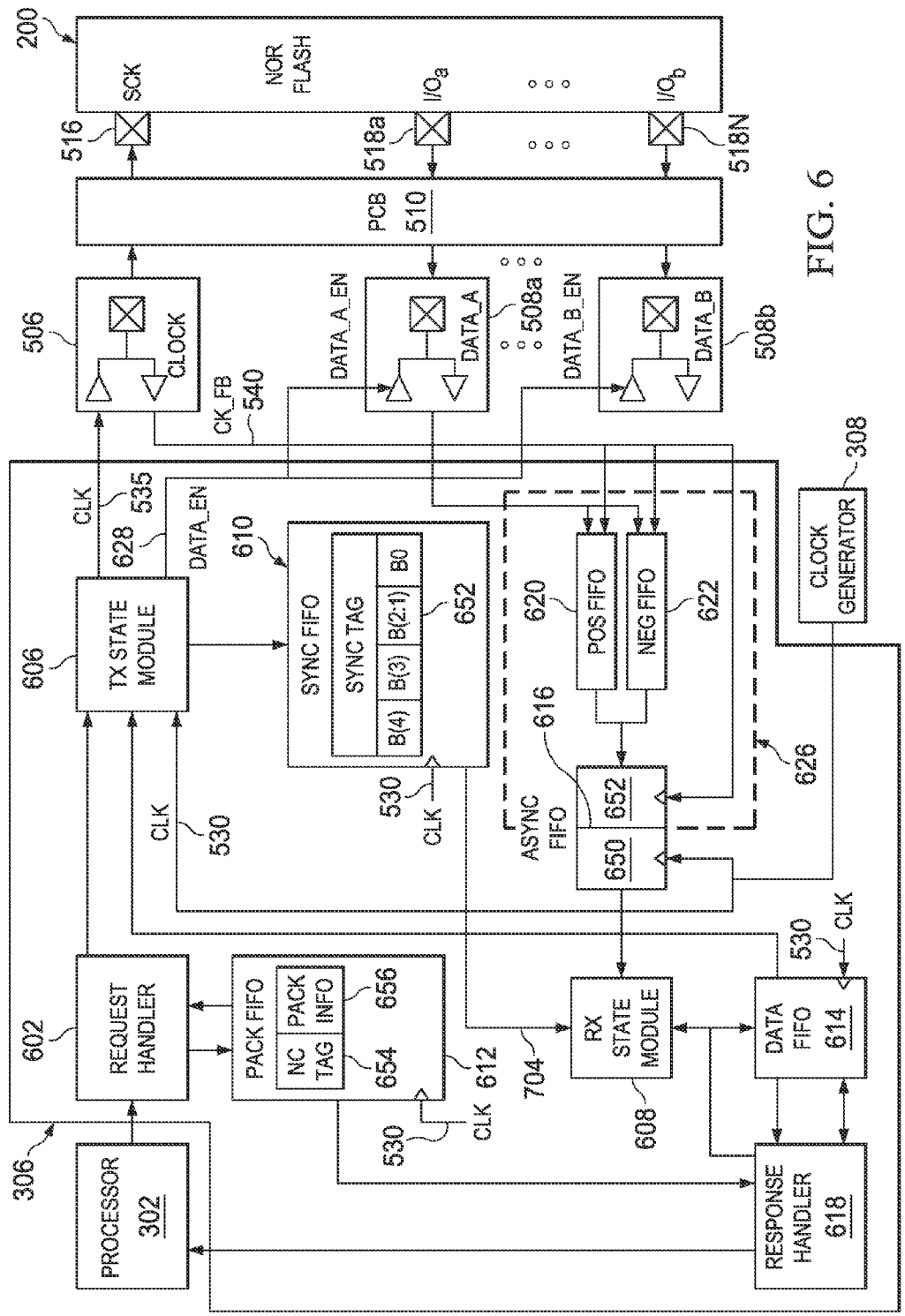
FIG. 6 illustrates a block diagram of an SoC core retrieving instructions of a boot code stored in a NOR flash memory device.

FIG. 6 illustrates a block diagram of SoC core 300 retrieving a boot code stored in NOR flash memory device 200. The SoC core 300 comprises processor 302, data capture logic 306, and clock generator 308. The data capture logic 306 includes the following hardware-implemented structures: a request handler 602; a transmitter (TX) state module 606; a receiver (Rx) state module 608; several storage elements (sync tag FIFO 610, pack FIFO 612, data FIFO 614, asynch FIFO 616, POS FIFO 620, and NEG FIFO 622); and a response handler 618. The data capture logic 306 interfaces with I/O pins 516, and 518a-b of NOR flash memory device 200 through PCB 510 and I/O sockets 506, 507, and 508a-b.

The three state modules (Tx, Rx, and Sequence) represent hardware-implemented state machines that may be configured using various different circuitry and combinational logic. Moreover, storage elements sync tag FIFO 610, pack FIFO 612, data FIFO 614, asynch FIFO 616, POS FIFO 620, and NEG FIFO 622 represent different hardware-implemented storage elements, such as, for example but without limitation, sets of flip-flops (e.g., SR, D, T, J-K, etc.), latches, buffers, or the like. Embodiments are not limited to any specific number or arrangement of flip-flops, latches, buffers, or other storage elements. Moreover, in on embodiment, these storage elements operate in a FIFO manner, but not all embodiments use such a storage scheme. Alternatively, FIFOs 610-616 and 620-622 may store information until cleared, instead of whenever new values are received.

The clock generator 308 generates internal CLK 530 that is provided to various components in the data capture logic 306. Tx state module 606 is one of the components receiving CLK 530 and generates CLK 535 based on CLK 530. In one embodiment, CLK 535 is a version of CLK 530 that only includes selected edges of CLK 530. CLK 535 is passed through I/O socket 506 to generate feedback clock signal CK_FB 540. As noted above, CK_FB 540 is a mesochronous (i.e., same frequency, different/unknown phase) version of CLK 530 that is generated by Tx state module 606 selectively passing CLK 535 through the retiming circuitry of I/O socket 506. Different hardware in the data capture logic 306 is operated at two different clock domains (CLK 530 and CK_FB 540). CLK 535 (selective CLK530) is provided to the NOR flash memory device 200 through I/O socket 506 and PCB 510. Dotted box 626 delineates the hardware running on CK_FB 540, i.e., POS FIFO 620, NEG FIFO 622, and the second portion 652 of async FIFO 616. The other hardware of the data capture logic 306 is run on CLK 530, i.e., request handler 602, Tx state module 606, pack FIFO 612, synch FIFO 610, Rx state module 608, data FIFO 614, and the first portion 650 of asynch FIFO 616.

In one embodiment, transparent pre-fetching of the data is achieved through a combination of two tag-based mechanisms. In addition to the loopback clock mechanism described beforehand to capture the data from the NOR Flash memory device 200 at high speed, the SPI controller 304 also automatically fetches data stored to the subsequent memory location, before those are even requested by the processor 302. When an SoC 300 is powered on or reset, processor 302 sends a request for the boot code to the request handler 602. The request handler 602 in turn sends to the Tx state module 606 a data read request at particular locations of the NOR flash memory device 200 through a "Start sequence command" and also informs the response handler 618 of this request through the pack FIFO 612. For example, the read requests from the request handler 602 may request data at address A0. The TX State module 606 starts retrieving the boot code data at A0, it will also predictively initiate the successive boot code read requests, at addresses A1, A2, and so on for successive clock cycles. These read requests likely relate to the boot code instructions necessary to boot up the processor 302.

Tx state module 606 is electrically coupled to sync FIFO 610 and receives both the start sequence command and CLK 530. Upon reception of the start sequence, the Tx state module 606 selectively generates CLK 535 from CLK 530 and provides CLK 535 to the Serial Flash device 200 through the clock I/O socket 506. The Tx state module 606, once enabled through the start sequence command, will stop providing the CLK 535 to the Serial Flash device 200 whenever data FIFO 614 is full and does not have space to store additional data. In one embodiment, once the entire Data FIFO 614 is filled up with the boot code instructions, the Tx state module 606 stops sending CLK 530. The Tx state module 606 constantly sends an "address reached" signal to the request handler 602 indicating the current Flash address that has been either captured in DATA FIFO 614 or at least requested for capture.

The NOR flash memory device 200 receives the selectively generated CLK 535 from the TX state module 606 at I/O pins 516. In one embodiment, Read Command sent through 508a DATA I/O socket on the particular edges of CLK 530 provided by Tx state module 606. In one embodiment, the NOR flash memory device 200 based on the read command it received outputs data on I/O pins 518a-b on both rising and falling edges of CLK 530 from Tx state module 606. This means that the Nor flash memory device 200 will output data at each clock edge of the CLK 535 sent by TX state module 606.

Data produced by the NOR flash memory device is captured in the POS FIFO 620 and the NEG FIFO 622. The data is produced on both rising and falling edges (i.e., DDR) with POS FIFO 620 capturing data on rising clock edges and NEG FIFO 622 capturing data on falling clock edges—both according to CK_FB 540. The outputs of POS FIFO 620 and NEG FIFO 622 are clocked into the second portion 652 of the async FIFO 616 at the rate of CK_FB 540 and clocked to the first portion 650 according to CLK 530.

The async FIFO 616 is an asynchronous memory element with a first portion 650 of storage (flip-flops, latches, buffers, or the like) being controlled by CLK 530 and a second portion 652 controlled by CK_FB 540. In operation, boot code data retrieved from the NOR flash memory device 200 are clocked into the second portion 652 at CK_FB 540 and retrieved from the first portion 650 at the CLK 530. Put another way, the async FIFO 616 stores retrieved boot code data at a rate (or clock) that is asynchronous from the rate such stored data is pulled.

For each transmitted cycle of CLK 530 (i.e., CLK 535) sent to NOR flash memory device 200, TX state module 606 generates and stores a synchronization tag (referred to herein as the "sync tag"). Sync tags are stored in the sync tag FIFO 610 on rising edge of CLK 535. In one embodiment, sync tag FIFO 610 comprises a set of five flip-flops 652, and the following sync tags can be stored therein:

TABLE 2

| Sync Tags | | | | | | | | |
|---|---|---|---|---|---|---|---|---|
| Bit(4) | | Bit(3) | | Bit(2) | | Bit(1) | | Bit(0) |
| 0 | PRV_SEQ | 0 | SDR | 0 | 0 | RSV | 0 | Ignore |
| 1 | NEW_SEQ | 1 | DDR | 0 | 1 | 1 data lines | 1 | Valid |
| | | | | 1 | 0 | 2 data lines | | |
| | | | | 1 | 1 | 4 data lines | | |

While alternative or additional sync tags may be used, the above sync tag commands include five bits B(4-0) of data to form commands. Two of those bits—B(2) and B(1)—are combined. B(4) indicates either a new sequence is to be started or a previous sequence is still being read. B(3) indicates the rate at which the Rx state module 608 captures data from the first portion 650 of the async FIFO 616. In B(2:1), one combination of values is reserved for expansion tags and the other three refer to the number of data transfer lines for receiving the boot code data, i.e., 1, 2, or 4 data transfer lines from the NOR flash memory device 200. B(0) indicates whether to ignore or capture a data bit in the async FIFO 616.

In one embodiment, data is received at the rate of one bit per clock cycle on a single I/O socket. Other embodiments use more complex operating modes where the data is received on multiple pads (2 in dual or 4 in quad mode) and sometimes at a DDR. Sync tags B(3) and B(2:1) provide for these different data-read complexities by respectively indicating the data rate and number of lines to read. This indicates to the Rx state module 608 how many data read bits to keep and where to find them.

At each positive edge of CLK 535, the Tx state module 606 sets B(0) to either valid or ignore to indicate whether valid data is to be expected on the I/Ob socket 508b. B(0) allows the Rx state module 608 to know what to do with each bit of data captured on CK_FB 540 edges (positive/negative) by simply reading the SYNC FIFO 610 entries one after the other. In one embodiment, there is a one-to-one correspondence between the edges of CLK 535 and those of CK_FB 540, while their phases are not synchronized. As soon as there is data in the async FIFO 616, the Rx state module 608 simultaneously reads the data in the first portion 610 and the sync tag stored in the sync FIFO 610. The sync tag instructs the Rx state module 608 on how to handle reading of that particular clock cycle of data in the async FIFO 616. The Rx state module 608 either captures or ignores the store data based on B(0) indicating a "valid" or "ignore" command of B(0), respectively. B(3) tells Rx state module 608 whether to capture the data in async FIFO 616 on single or dual edges. B(4) signals a new read request. The generation and use of the sync tags on each cycle of CLK 530 sent to NOR flash memory device 200 provides a way to reliably manage high-speed data rate captures without needing to perform difficult synchronization techniques to the DATA_EN signal 628, which may be provided to the to I/O sockets 508a-b as DATA_EN A and B, respectively.

Along with the start sequence command, the request handler 602 generates a single bit tag (referred to herein as an "NC tag" 654) for every read request, and the pack FIFO 612 stores the NC tag 654. The NC tag 654 indicates the read requests as being either non-contiguous or contiguous. Even though the request handler 602 will provide a new entry to PACK FIFO 612 for each new read request, it will set the NC tag 654 to "1" only if it receives a non-contiguous request; otherwise, the NC tag 654 will remain a "0" to indicate a contiguous request. A read request is deemed non-contiguous if the address of the read request is not equal to the address and read data size of the previous read request. A contiguous NC tag 654 indicates the current read request address equals the previous request address plus a read size of the new read request. For contiguous requests, the request handler 602 stores corresponding NC tags 654 as "0" in the pack FIFO 612. For non-contiguous requests, the request handler 602 checks whether the Tx state module 606 has sent the "address reached" signal. If so, the request handler 602 stores a non-contiguous NC tag 654 as "1" in the pack FIFO 612 indicating to the response handler 618 that a non-contiguous request has been initiated by the processor 306. Along with setting NC tag 654, request handler 602 also sends a new start sequence signal. The request handler 602 will generate a new sequence signal and set NC tag 654 only when the request handler 602 receives a non-contiguous request.

The response handler 602 receives data from the pack FIFO 612 once the pack FIFO 612 has any packet along with NC tag 654 entries. In one implementation, this is done by the pack FIFO 612 sending a "not empty" signal to the request handler 618. When the not empty signal is received, the response handler 618 reads the boot code data stored in the data FIFO 614 (as soon as data is available in data FIFO 614) and provides such data to the processor 302. This data comprises the boot code data captured from the NOR flash memory device 200 and propagated through the POS, NEG, COMBO, and async FIFOs. Pack FIFO 612 also sends the NC tags 654 for each data address read request, and once the response handler receives a non-contiguous NC tag 654, the response handler 618 sends a reset signal to the pack FIFO 612 and an end signal to the Rx state module 604. The end signal instructs the Rx state module 608 to stop capturing data from the async FIFO 616 and thus instructs the Rx state module 608 to discard all the data read from the async FIFO 616, regardless of the current sync tag. The Rx state module 608 complies until it receives a new start read signal. This new start read signal is indicated using the B(4) bit of the previously discussed sync tag 652. Just like the rest of sync tag 652 bits, the Tx state module 606 generates this bit on each transmitted CLK 535 but sets the Bit(4) to "1" only when the TX state module receives the start sequence signal from the request handler 602 (which is generated by request handler 602 for every non-contiguous request). The tag-based techniques disclosed herein thus allows for efficient clean-up of all over-read and previously pipelined data in parallel without any the penalty of for non-contiguous accesses.

Tx state module 606 and Rx state module 608 manage CLK 535, sync tag 652 generation, and selective data capture in the DATA FIFO 614. When the DATA FIFO 614 is not full, a "not full" signal is generated and sent to the Tx state module 606. The TX state module 606 continues to send CLK 535 leading to continuous data capture in the async FIFO 616 and then in data FIFO 614 until the FIFO full signal is received. This leads to capture of the read data ahead and possibly even before the next read request, i.e., in a pre-fetching manner. This provides an advanced availability of data for the next contiguous request that may be delayed by interconnect and system latency.

The response handler 618 retrieves data from the PACK FIFO 612 (both NC TAG 654 and PACK info data 656) when PACK FIFO 612 and DATA FIFO 614 are not empty. Response handler 618 provides the retrieved data from DATA FIFO 614 to processor 302. The pre-fetching by Rx state module 608 allows the response handler 618 to find the bulk of the boot code data immediately in the DATA FIFO 614, allowing the response handler 618 to respond back to processor 302 almost immediately and thereby overcoming flash interface delays.

The NC TAG will be used by the response handler 618 whenever the system sends a non-contiguous request. As previously mentioned, the request handler 602 will generate the new sequence signal and also push an entry to PACK FIFO 612 with an NC TAG 654 indicating a non-contiguous request. The new sequence signal causes the Tx state module 606 to generate a synch tag with B(4) set to a value of 1. In response to the NC tag 654 indicating a non-contiguous request in the PACK FIFO 612, the response handler 618 will generate a software reset signal for the DATA FIFO 614. In response to the software reset signal, the DATA FIFO 614 flushes its stored pre-fetched data. The software reset signal is also sent to and used by the Rx state module 608 in parallel to ignore the data in the read path pipeline of the POS FIFO 620, NEG FIFO 622, and ASYNC FIFO 650-652.

Use of the NC tag 654 and sync tags 652 provide the ability to avoid interconnect latency by pre-fetching boot data for quick availability to the processor 302. This in turn provides faster boot times and allows dynamic, immediate clean-up of the DATA FIFO 614 and read path pipeline (i.e., POS FIFO 620, NEG FIFO 622, and ASYNC FIFO 650-652) for any non-contiguous requests.

It should be appreciated that the various embodiments disclosed herein are exemplary. Accordingly, various modifications to these embodiments may be made without departing from the scope of the present disclosure and the claims provided below. The subject matter of the present invention is described with specificity herein to meet statutory requirements. The description itself is not, however, intended to limit the scope of this patent. The claimed subject matter might also be embodied in other ways, to include different steps or combinations of steps similar to the ones described herein, in conjunction with other present or future technologies.

What is claimed is:

1. A system comprising a controller operating on a controller clock signal and electrically coupled to a flash memory device through an input/output (I/O) socket and capable of receiving data from the flash memory device, the system comprising:

a transmitter state module receiving the controller clock signal and configured to generate a selective clock signal based on the controller clock signal and configured to provide the selective clock signal to the I/O socket, wherein passage of the selective clock signal through the I/O socket creates a feedback clock signal; and data capture logic configured to receive the feedback clock signal from the I/O socket and comprising one or more storage elements configured to capture data from the flash memory device according to the feedback clock signal;

wherein the one or more storage elements of the data capture logic comprise a negative first-in-first-out storage element for capturing the data from the flash memory device on negative edges of the feedback clock signal.

2. The system of claim 1, wherein the selective clock signal comprises fewer rising edges than the controller clock signal.

3. The system of claim 1, wherein the feedback clock signal is mesochronous compared to the controller clock signal.

4. The system of claim 1, wherein the one or more storage elements of the data capture logic comprise a positive first-in-first-out storage element for capturing the data from the flash memory device on positive edges of the feedback clock signal.

5. The system of claim 4, further comprising an asynchronous storage element configured to store both the data captured by the negative first-in-first-out storage element and the positive first-in-first-out storage element according to the feedback clock signal.

6. The system of claim 1, wherein the data comprises boot code, and the data capture logic provides the boot code to a processor for initiating start-up of the processor.

7. The system of claim 1, wherein the controller is a serial peripheral controller.

8. The system of claim 1, wherein the flash memory device comprises one or more serial NOR flash memory devices.

9. A system comprising a controller operating on a controller clock signal and electrically coupled to a flash memory device through an input/output (I/O) socket and capable of receiving data from the flash memory device, the system, comprising:

a transmitter state module receiving the controller clock signal and configured to generate a selective clock signal based on the controller clock signal and configured to provide the selective clock signal to the I/O socket, wherein passage of the selective clock signal through the I/O socket creates a feedback clock signal;

data capture logic configured to receive the feedback clock signal from the I/O socket and comprising one or more storage elements configured to capture data from the flash memory device according to the feedback clock signal; and an asynchronous storage element with a first portion capturing data from the flash memory device according to the feedback clock signal and a second portion capturing data in the first portion at the controller clock signal.

10. The system of claim 9, further comprising a receiver state module configured to:
retrieve the data stored in the second portion of the asynchronous storage element until an end-of-sequence command is received,
receive one or more synchronization tags for bits of the data from a synchronization storage element, and
store the retrieved data in a data storage element.

11. The system of claim 10, further comprising:
a response handler; and
a pack storage element configured to provide the response handler with a first command to signal the response handler to read the data in the data storage element for a period of time and a second command to signal the response handler to stop reading the data in the data storage element.

12. The system of claim 11, wherein the pack storage element receives read requests and is configured to generate tags for the read requests, wherein each of the generated tags indicate whether a corresponding read request is contiguous or non-contiguous.

13. The system of claim 10, wherein the controller is a serial peripheral controller.

14. The system of claim 10, wherein the flash memory device comprises one or more serial NOR flash memory devices.

15. The system of claim 10, wherein the transmission state module is configured to generate synchronization tags for each of the read requests, the synchronization tags indicating at least one member of a group comprising:
a previous or new sequence of read requests,
a single or double rate for capturing data,
a number of data transfer lines between the controller and the flash memory device, and
whether to capture or ignore a particular data bit.

16. The system of claim 9, wherein the one or more storage elements of the data capture logic comprise a negative first-in-first-out storage element for capturing the data from the flash memory device on negative edges of the feedback clock signal.

17. The system of claim 16, wherein the one or more storage elements of the data capture logic comprise a positive first-in-first-out storage element for capturing the data from the flash memory device on positive edges of the feedback clock signal.

18. The system of claim 16, further comprising an asynchronous storage element configured to store both the data captured by the negative first-in-first-out storage element and the positive first-in-first-out storage element according to the feedback clock signal.

19. The system of claim 9, wherein the selective clock signal comprises fewer rising edges than the controller clock signal.

20. The system of claim 9, wherein the feedback clock signal is mesochronous compared to the controller clock signal.

21. The system of claim 9, wherein the data comprises boot code, and the data capture logic provides the boot code to a processor for initiating start-up of the processor.

22. The system of claim 9, wherein the controller is a serial peripheral controller.

23. The system of claim 9, wherein the flash memory device comprises one or more serial NOR flash memory devices.

24. A system comprising a controller operating on a controller clock signal and electrically coupled to a flash memory device through an input/output (I/O) socket and capable of receiving data from the flash memory device, the system comprising:
a request handler configured to receive read requests from a processor and store tags corresponding to the read requests in a pack storage element, wherein the tags indicate whether each of the read requests are contiguous or non-contiguous;
a transmission state module configured to generate a selective clock signal based on the controller clock signal and provide the selective clock signal to the I/O socket to generate a feedback clock signal;
data capture logic configured to receive the feedback clock signal from the I/O socket and comprising one or more additional storage elements configured to capture data from the flash memory device according to the feedback clock signal; and
a response handler configured to provide the processor with the data until a non-contiguous tag is received.

25. A system comprising a controller operating on a controller clock signal and electrically coupled to a flash memory device through an input/output (I/O) socket and capable of receiving data from the flash memory device, the system comprising:
a request handler configured to receive read requests from a processor and store tags corresponding to the read requests in a pack storage element, wherein the tags indicate whether each of the read request are contiguous or non-contiguous;
a transmission state module configured to generate a selective clock signal based on the controller clock signal and provide the selective clock signal to the I/O socket to generate a feedback clock signal, the transmission state module is also configured to generate synchronization tags for each of the read requests;
data capture logic configured to receive the feedback clock signal from the I/O socket and comprising one or more additional storage elements configured to capture data from the flash memory device according to the feedback clock signal;
a receiver state module configured to retrieve and store the data captured by the data capture logic in a data memory element according to the controller clock signal; and
a response handler configured to provide the processor with the data until a non-contiguous tag is received.

26. The system of claim 25, wherein data capture logic comprises an asynchronous first-in-first-out memory element with a first portion receiving the data according to the feedback clock signal and a second portion receiving the data in the first portion according to the controller clock signal.

27. The system of claim 25, wherein the synchronization tags indicate at least one member of a group comprising:
a previous or new sequence of read requests,
a single or double rate for capturing data,
a number of data transfer lines between the controller and the flash memory device, and
whether to capture or ignore a particular data bit.

* * * * *